US007479813B2

(12) United States Patent
Kase et al.

(10) Patent No.: US 7,479,813 B2
(45) Date of Patent: Jan. 20, 2009

(54) LOW VOLTAGE CIRCUIT WITH VARIABLE SUBSTRATE BIAS

(75) Inventors: Kiyoshi Kase, Austin, TX (US); Dzung T. Tran, Austin, TX (US); May Len, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 175 days.

(21) Appl. No.: 11/424,132

(22) Filed: Jun. 14, 2006

(65) Prior Publication Data

US 2008/0122520 A1 May 29, 2008

(51) Int. Cl.
*H03B 1/00* (2006.01)
*H03K 3/00* (2006.01)

(52) U.S. Cl. ........................... 327/108; 326/68; 326/81; 327/534; 327/537; 327/333

(58) Field of Classification Search ............. 326/62–81; 327/333, 530, 534–538, 543–546, 108–112
See application file for complete search history.

(56) References Cited

U.S. PATENT DOCUMENTS 5,153,451 A 10/1992 Yamamura et al.
6,249,145 B1 * 6/2001 Tanaka et al. ................. 326/68
6,362,655 B1 3/2002 Abraham et al.
6,628,149 B2 * 9/2003 Ajit ............................ 327/108
6,707,339 B1 3/2004 Kase et al.
7,002,371 B2 2/2006 Kase et al.
2003/0174007 A1 9/2003 Suga
2006/0071285 A1 4/2006 Datta et al.
2006/0103435 A1 5/2006 Chen et al.

OTHER PUBLICATIONS

Design and Analysis of Integrator-based Log-Domain Filter Circuits 1.1.1 MOS-C Filters.*

* cited by examiner

*Primary Examiner*—Long Nguyen
*Assistant Examiner*—Brandon S Cole
(74) *Attorney, Agent, or Firm*—Daniel D. Hill; Robert L. King

(57) ABSTRACT

In one form a circuit has a bias stage having an input signal terminal for receiving an input signal. The circuit modifies the input signal with a drive stage to provide an output signal in complement form. A drive transistor in the drive stage of the circuit has a bulk that is connected to a terminal of a load and to a control electrode coupled to the input signal terminal. A bias transistor in the bias stage of the circuit has a bulk that is directly connected to the terminal of the load and to the bulk of the drive transistor. The bias transistor has a control electrode coupled to the input signal terminal. The input signal biases the bulks of the drive transistor and the bias transistor and reduces transistor threshold voltage. Linearity of circuit output impedance is improved and RF interference reduced. Lower voltage operation is also provided.

23 Claims, 2 Drawing Sheets

LOW VOLTAGE CIRCUIT WITH VARIABLE SUBSTRATE BIAS

RELATED APPLICATION

A related, copending application is entitled "Variable Impedance Output Buffer", by Kase et al., application Ser. No. 10/926,121, assigned to Freescale Semiconductor, and was filed on Aug. 25, 2004.

FIELD OF THE INVENTION

This invention relates to integrated circuits, and more particularly to a circuit with variable substrate bias.

BACKGROUND OF THE INVENTION

A complementary metal-oxide semiconductor (CMOS) driver circuit commonly includes a P-channel transistor and an N-channel transistor connected in series between a positive power supply voltage terminal and a ground terminal. The gates of the transistors receive an input signal, and an output terminal of the driver circuit is located between the transistors. The P-channel transistor functions as a "pull-up" transistor, and the N-channel transistor functions as a "pull-down" transistor. The driver circuit is commonly used to drive a transmission line on a printed circuit board or flexible cable. The output impedance of the driver circuit should be as linear as possible and matched to the impedance of the transmission line to reduce ringing and the resultant high frequency noise. As power supply voltages are reduced to two volts and below, achieving linearity in the driver circuit becomes more difficult. Therefore, what is needed is a low voltage circuit having more linear output impedance.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
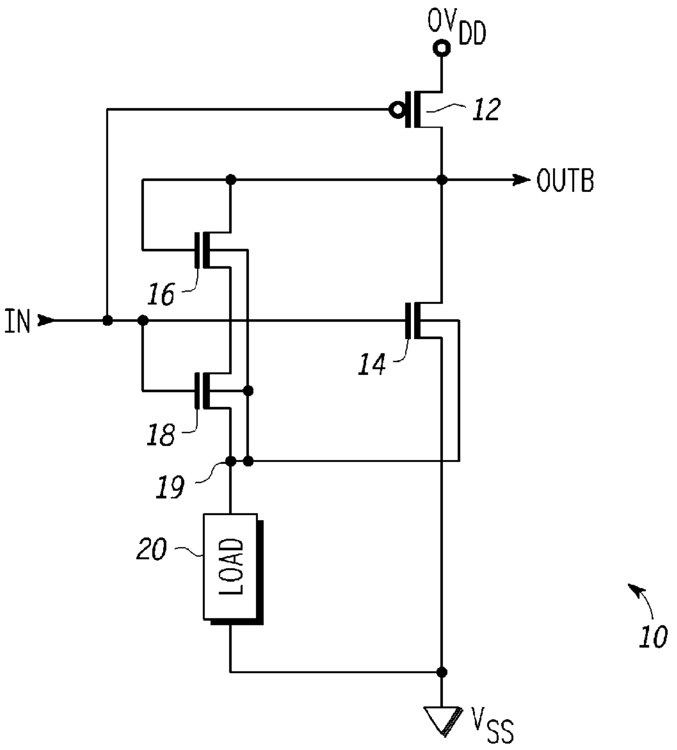
FIG. 1 illustrates, in schematic diagram form, an output buffer circuit in accordance with one embodiment.

Generally, the present invention provides a circuit having a variable, or dynamic, threshold voltage ($V_T$). The circuit is used as an output buffer in the illustrated embodiments and includes a bias stage having a bias switch and a resistive element to lower and raise the substrate bias of a drive transistor in respond to an input signal. When the input signal causes the drive transistor to become conductive, the substrate bias of the drive transistor is increased, thus reducing the $V_T$ of the drive transistor. When the input signal causes the drive transistor to become substantially non-conductive, the substrate bias of the drive transistor is reduced, thus reducing the $V_T$ of the drive transistor. By changing the $V_T$ of the driver transistor in response to the input signal, the circuits of the illustrated embodiments provide for more linear output impedance at lower power supply voltages (e.g. in a range of 1 to 2 volts). Also, the drive transistor of the output buffer circuit will produce a higher drive current, thus allowing the drive transistor to be smaller. In addition, raising the $V_T$ of the drive transistor when the drive transistor is non-conductive reduces leakage current.

In one form, a circuit comprises a first transistor, a second transistor, a resistive load, and output drive circuitry. The first transistor is of a first conductivity type, has a first current electrode coupled to an output terminal, a control electrode coupled to an input signal terminal, a second current electrode, and a bulk having a substrate connection terminal connected directly to the second current electrode. The second transistor is of the first conductivity type, has a first current electrode coupled to the output terminal, a control electrode coupled to the control electrode of the first transistor, a second current electrode coupled to a voltage terminal, and a bulk having a substrate connection terminal connected directly to the substrate connection terminal of the first transistor. The resistive load is coupled between the second current electrode of the first transistor and the voltage terminal. The output drive circuitry is coupled to the output terminal.

In another form, the circuit comprises a bias stage having an input signal terminal for receiving an input signal. The circuit modifies the input signal with a drive stage to provide an output signal in complement form. The circuit comprises a load, a drive transistor, and a bias transistor. The drive transistor is in the drive stage of the circuit, has a bulk connected to a terminal of the load and a control electrode coupled to the input signal terminal. The bias transistor is in the bias stage of the circuit. The bias transistor has a bulk that is directly connected to the terminal of the load and to the bulk of the drive transistor. The bias transistor has a control electrode coupled to the input signal terminal. The voltage applied to the bulk of the drive transistor and the bulk of the bias transistor varies in response to the input signal.

In yet another form, a circuit comprises a load, first and second transistors, and a pull-up transistor. The load has a first terminal coupled to a first voltage terminal, and a second terminal. The first transistor has a control electrode coupled to an input signal terminal, a first current electrode coupled to a complementary output terminal and both a second current electrode and a bulk connected together and to the second terminal of the load. The second transistor has a control electrode coupled to the input signal terminal, a first current electrode coupled to the first voltage terminal, a second current electrode coupled to the complementary output terminal, and a bulk connected to the bulk of the first transistor. The pull-up transistor is coupled in series with the second transistor, and is located between a second voltage terminal and the complementary output terminal.

The term "coupled", as used herein, is defined as connected, although not necessarily directly, and not necessarily mechanically.

FIG. 1 illustrates, in schematic diagram form, an output buffer circuit 10 in accordance with one embodiment. Output buffer circuit 10 is an inverting type of output buffer circuit, but in other embodiments can be non-inverting. Also note that in FIG. 1 circuit 10 functions as an output buffer but in other embodiments can have a different function, such as for example, an input buffer. Circuit 10 includes P-channel transistor 12, N-channel transistors 14, 16, and 18, and resistive element, or load, 20. The transistors of circuit 10 are CMOS transistors where each transistor has a gate, source and drain. The gate functions as a control electrode and the source and drain function as current electrodes. P-channel transistor 12 has a source coupled to a power supply voltage terminal for receiving a power supply voltage labeled "$OV_{DD}$", a gate for receiving an input signal labeled "IN", and a drain for providing an output signal labeled "OUTB". In the illustrated embodiment, the power supply voltage $OV_{DD}$ is a specific output driver power supply voltage. In other embodiments the power supply voltage may be the same as an internal power supply voltage of the integrated circuit. The input signal IN is generated by logic circuits (not shown) and represents a logic one or a logic zero with a high or a low voltage, respectively. P-channel transistor 12 is for pulling up, or increasing, the voltage of output signal OUTB in response to a low input signal IN. N-channel transistor 14 is a driver transistor for pulling down or reducing the voltage of output signal OUTB. Transistor 14 has a drain coupled to the drain of transistor 12, a gate for receiving input signal IN, and a source coupled to a power supply voltage terminal labeled "$V_{SS}$". In the illustrated embodiment, $V_{SS}$ is coupled to ground and $OV_{DD}$ is coupled to receive a positive power supply voltage. In other embodiments, the power supply voltage provided to $OV_{DD}$ and $V_{SS}$ may be different. N-channel transistor 16 has a gate and a drain both coupled to the drain of transistor 14, and a source. N-channel transistor 18 has a drain coupled to the source of transistor 16, a gate coupled to the gate of transistor 14, and a source. The resistive element 20 labeled "LOAD" has a first terminal coupled to the source of transistor 18 at an internal node 19, and a second terminal coupled to $V_{SS}$. A substrate, or bulk, terminal of each of N-channel transistors 14, 16, and 18 is coupled to the first terminal of resistive element 20 at node 19. A substrate, or bulk, terminal (not shown) of P-channel transistor 12 is coupled to $OV_{DD}$. Transistors 12 and 14 together form a driver stage where transistor 12 is the pull-up device and transistor 14 is the pull-down device. Transistors 16 and 18 form a substrate bias stage.

As an example of normal operation of output buffer circuit 10, input signal IN transitions between a logic high voltage and a logic low voltage in response to internal circuitry (not shown) of the integrated circuit having circuit 10. When input signal IN is a logic low voltage, N-channel transistors 14 and 18 are substantially non-conductive, P-channel transistor 12 is conductive causing output signal OUTB to be increased to about $OV_{DD}$. Note that a signal name followed by the letter "B" is a logical complement of a signal name lacking the "B".

Figure 3:
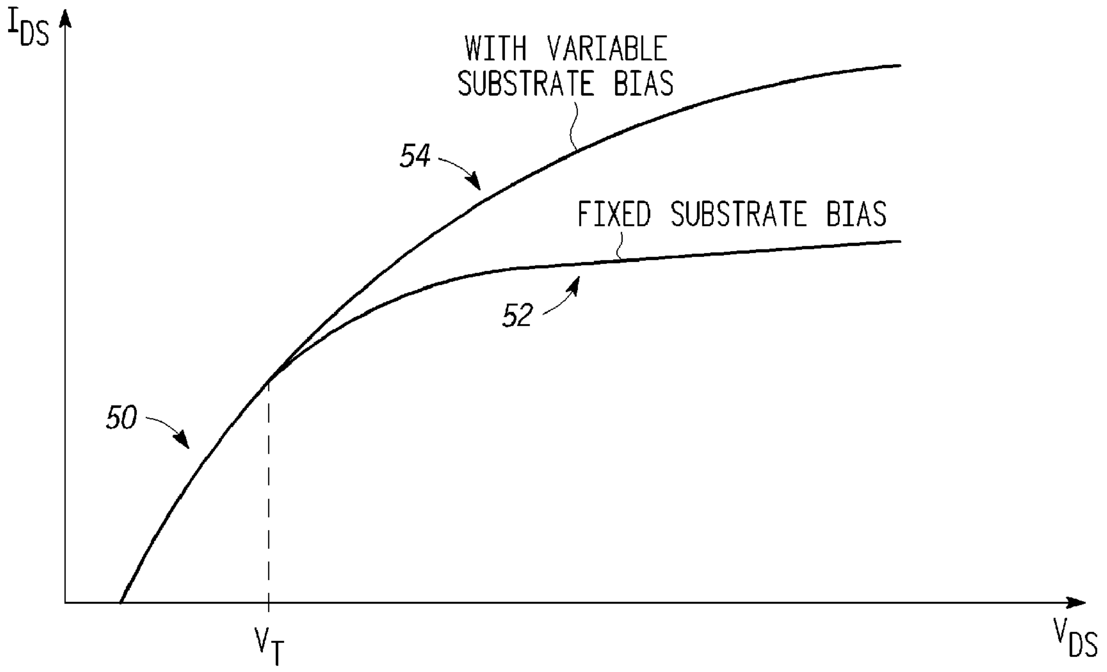
FIG. 3 illustrates a drain-source current of the pull-down driver transistor of either the circuit of FIG. 1 or FIG. 2 as a function of drain-source voltage.

When input signal IN is a logic high voltage, P-channel transistor 12 is substantially non-conductive and N-channel transistor 14 is conductive to pull-down, or reduce, the voltage of OUTB to a logic low voltage equal to approximately $V_{SS}$. Also, N-channel transistor 18 is conductive causing a current through transistors 16 and 18 and resistive element 20 to produce a predetermined voltage at node 19 that is greater than ground potential. The voltage at node 19 is dependent on the current and the resistance of resistive element 20 and functions to increase the substrate voltage of transistors 16, 18, and 14, thus lowering the $V_T$ of transistors 16, 18, and 14. The lower $V_T$ of transistor 14 causes circuit 10 to have a more linear output impedance characteristic. Also, the lower $V_T$ causes transistor 14 to turn on "harder", or more completely as the gate voltage increases, thus producing a higher drive current than a comparably sized transistor with a fixed voltage. A drain-to-source current ($I_{DS}$) of transistor 14 is illustrated in FIG. 3 and will be discussed later.

Transistor 16 is "diode-connected" and functions as a level shifter to reduce the voltage received by transistor 18. This will allow transistor 18 to be smaller. In a preferred embodiment, resistive element 20 is implemented as an N-channel transistor with its gate coupled to $OV_{DD}$, a drain coupled to node 41, and a source coupled to $V_{SS}$. In other embodiments, resistive element 20 may be a different type of resistor, such as a long channel device or a polysilicon resistor.

Figure 2:
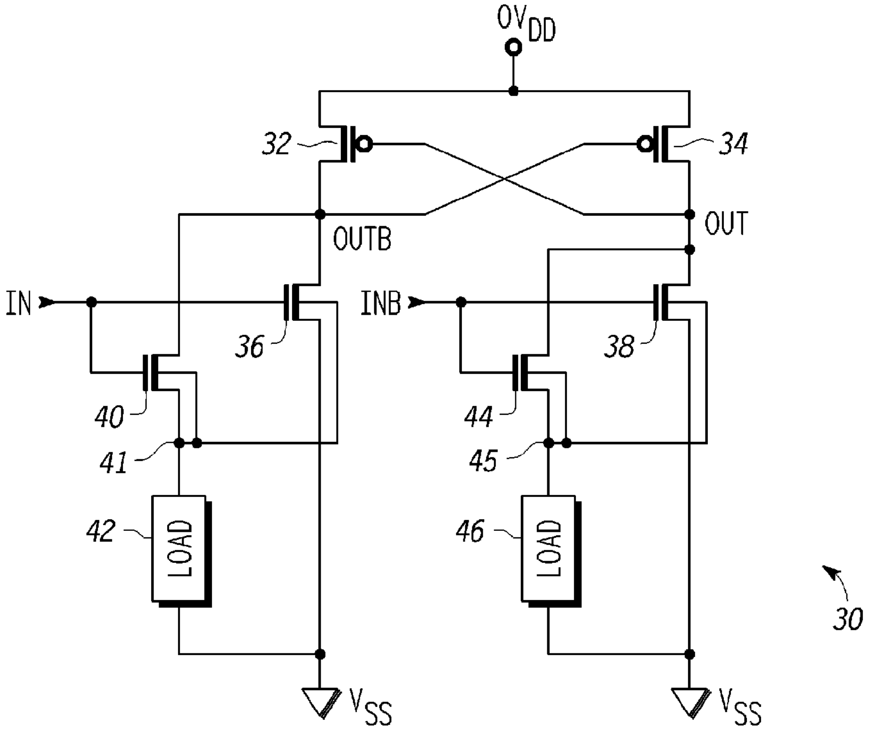
FIG. 2 illustrates, in schematic diagram form, a level shifter circuit in accordance with a second embodiment.

FIG. 2 illustrates, in schematic diagram form, level shifter circuit 30 in accordance with a second embodiment. Level shifter circuit 30 is an inverting type of level shifter, but in other embodiments can be non-inverting. Level shifter circuit 30 includes a cross-coupled pair of P-channel transistors 32 and 34, N-channel transistors 36, 38, 40, and 44, and resistive elements 42 and 46. The transistors of circuit 30 are CMOS transistors where each transistor has a gate, source and drain. The gate functions as a control electrode and the source and drain function as current electrodes. P-channel transistor 32 has a source coupled to power supply voltage terminal $OV_{DD}$, a gate, and a drain for providing output signal OUTB. P-channel transistor 34 has a source coupled to power supply voltage terminal $OV_{DD}$, a gate coupled to the drain of transistor 32, and drain coupled to the gate of transistor 32. N-channel transistor 36 has a drain coupled to the drain of P-channel transistor 32, a gate coupled to receive input signal IN, and a source coupled to $V_{SS}$. N-channel transistor 40 has a drain coupled to the drain of N-channel transistor 36, a gate coupled to receive input signal IN, and a source coupled to internal node 41. Resistive element 42 has a first terminal coupled to the source of N-channel transistor 40, and a second terminal coupled to $V_{SS}$. N-channel transistor 38 has a drain coupled to the drain of P-channel transistor 34, a gate for receiving input signal INB, and a source coupled to $V_{SS}$. N-channel transistor 44 has a drain coupled to the drain of N-channel transistor 38, a gate for receiving input signal INB, and a source coupled to internal node 45. Resistive element 46 has a first terminal coupled to the source of N-channel transistor 44, and a second terminal coupled to $V_{SS}$. Resistive elements 42 and 46 function as loads and may be passive or active devices. Input signals IN and INB are differential signals and are provided by internal circuitry (not shown). Likewise, output signals OUT and OUTB are differential signals.

The substrates of N-channel transistors 36 and 40 are coupled to the source of N-channel transistor 40 at node 41. The substrates of N-channel transistors 38 and 44 are coupled to the source of N-channel transistor 44 at node 45.

As an example of normal operation, when input signal IN is a logic low, N-channel transistors 36 and 40 are substantially non-conductive, and P-channel transistor 32 is conductive causing output signal OUTB to be a logic high voltage and output signal OUT to be a logic low. Input signal INB is a logic high, causing N-channel transistors 38 and 44 to be conductive. Output signal OUT is pulled to a logic low and the current through transistor 44 causes a voltage drop across resistive element 46 that causes the voltage at node 45 to be a predetermined voltage above $V_{SS}$. The voltage at node 45 will raise the substrate bias voltage and thus lower the $V_T$ of transistors 38 and 44. The lower $V_T$ allows drive transistor 38 to turn on more completely in response to the logic high input signal IN. This provides a more linear output impedance. Also, because transistor 38 turns on more completely, transistor 38 can drive more current. Therefore, the overall size of transistor 38 can be reduced to maintain a comparable driver capability. Also, because transistor 38 turns on stronger, the overall speed of level shifter 30 is improved. The drain current of transistor 38 is illustrated in FIG. 3 and will be discussed later.

When input signal IN transitions to a logic high voltage, input signal INB transitions to a logic low. As the voltage of INB decreases, the N-channel transistors 38 and 44 turn off, causing the voltage at node 45 to reduce to about ground potential through resistive load 46. This reduces the substrate bias of transistors 38 and 44, thus increasing the $V_T$ of transistors 38 and 44 and allowing them to turn off more completely. This reduces leakage current through transistors 38 and 44. The logic high input signal IN causes transistors 36 and 40 to become conductive and causes P-channel transistor 34 to become conductive reducing output signal OUTB to a logic low and increasing output signal OUT to a logic high. A voltage at node 41, due to the voltage drop across resistive element 42, raises the substrate bias of transistors 36 and 40 and lowers the $V_T$ of transistors 36 and 40 as described above for transistors 38 and 44.

P-channel transistors 32 and 34 are cross-coupled. When P-channel transistor 32 is conductive and N-channel transistor 36 is non-conductive, output signal OUTB is pulled high, the high output signal OUTB causes P-channel transistor 34 to be non-conductive and output signal OUT is a logic low by N-channel transistor 38.

In another embodiment of circuit 30, transistor 44 and resistive element 46 may not be present. Also, in another embodiment, a diode-connected transistor, such as transistor 16 in FIG. 1, may be included to level shift, or reduce, the voltage at the drain of transistor 40, transistor 44, or both.

FIG. 3 illustrates a drain current $I_{DS}$ of the pull-down driver transistors of either circuit 10 or circuit 30, as compared to the drain current of a conventional circuit, as a function of drain-to-source voltage $V_{DS}$. As the drain voltage $V_{DS}$ increases, the driver transistor 14 or 38 operates in an active region and the drain current ID generally follows a drain current curve 50. When $V_{DS}$ reaches the $V_T$ (for example, 0.3 volts) of driver transistor 14 or 38, the driver transistor 14 or 38 turns on more fully and begins to operate in the saturation region. If the threshold voltage is fixed, as in the prior art, the drain current $I_{DS}$ will generally follow drain current curve 52 and flatten out. If the threshold voltage is variable as described above regarding the circuits 10 and 30 of FIG. 1 and FIG. 2, respectively, the drain current $I_{DS}$ will follow a drain current curve 54. Note that drain current curve 54 is relatively more linear than drain current curve 52. Also, as can be seen in FIG. 3, for comparably sized drive transistors the drain current curve 54 is higher than the drain current curve 52 because the variable substrate bias of circuits 10 and 30 cause transistors 14 and 38 to turn on more completely.

Various changes and modifications to the embodiments herein chosen for purposes of illustration will readily occur to those skilled in the art. For example, variations in the types of conductivities of transistors, the types of transistors, etc. may be readily made. One skilled in the art will recognize that even though the embodiments of the present invention are directed to biasing a pull-up output driver device, the conductivity types of the transistors can be changed and the circuit schematic reversed to lower the $V_T$ of a pull-up output driver transistor. To the extent that such modifications and variations do not depart from the spirit of the invention, they are intended to be included within the scope thereof which is assessed only by a fair interpretation of the following claims.

What is claimed is:

1. A circuit comprising:

a first transistor of a first conductivity type having a first current electrode coupled to an output terminal, a control electrode coupled to an input signal terminal, a second current electrode, and a bulk having a substrate connection terminal connected directly to the second current electrode;

a second transistor of the first conductivity type having a first current electrode coupled to the output terminal, a control electrode coupled to the control electrode of the first transistor, a second current electrode coupled to a voltage terminal, and a bulk having a substrate connection terminal connected directly to the substrate connection terminal of the first transistor;

a resistive load coupled between the second current electrode of the first transistor and the voltage terminal; and output drive circuitry coupled to the output terminal.

2. The circuit of claim 1 further comprising:

a third transistor having a first current electrode coupled to the output terminal, a control electrode connected to the first current electrode thereof, a second current electrode connected to the first current electrode of the first transistor, and a bulk having a substrate connection terminal connected directly to the substrate connection terminal of both the first transistor and the second transistor.

3. The circuit of claim 1 wherein the output drive circuitry further comprises:

a third transistor of a second conductivity type opposite the first conductivity type having a first current electrode coupled to a second voltage terminal, a second current electrode coupled to the output terminal and a control electrode coupled to the input signal terminal.

4. The circuit of claim 1 wherein the output drive circuitry further comprises:

a third transistor of a second conductivity type opposite the first conductivity type having a first current electrode coupled to a second voltage terminal, a second current electrode coupled to the output terminal and a control electrode coupled to a complementary output terminal; and a fourth transistor of the second conductivity type having a first current electrode coupled to the second voltage terminal, a second current electrode coupled to the complementary output terminal and a control electrode coupled to the output terminal.

5. The circuit of claim 4 further comprising:

a fifth transistor of the first conductivity type having a first current electrode coupled to the complementary output terminal, a control electrode coupled to a complement input signal terminal, a second current electrode, and a bulk having a substrate connection terminal connected directly to the second current electrode thereof;

a sixth transistor of the first conductivity type having a first current electrode coupled to the complementary output terminal, a control electrode coupled to the control electrode of the fifth transistor, a second current electrode coupled to the voltage terminal, and a bulk having a substrate connection terminal connected directly to the substrate connection terminal of the fifth transistor; and a second resistive load coupled between the second current electrode of the fifth transistor and the voltage terminal.

6. The circuit of claim 5 wherein the first conductivity type is N conductivity and the second conductivity type is P conductivity.

7. The circuit of claim 5 wherein the output drive circuitry further comprises:

a pair of cross-coupled transistors of a second conductivity type opposite the first conductivity type, the pair of cross-coupled transistors respectively providing drive current for true and complement outputs of the circuit.

8. The circuit of claim 1 wherein the resistive load is one of either a transistor or a polysilicon resistor.

9. A circuit comprising a bias stage having an input signal terminal for receiving an input signal, the circuit modifying the input signal with a drive stage to provide an output signal in complement form, comprising:

a load;

a drive transistor in the drive stage of the circuit, the drive transistor having a bulk connected to a terminal of the load and a control electrode coupled to the input signal terminal; and a bias transistor in the bias stage of the circuit, the bias transistor having a bulk that is directly connected to the terminal of the load and to the bulk of the drive transistor, the bias transistor having a control electrode coupled to the input signal terminal, the bias transistor having a current electrode directly connected to both the terminal of the load and to the bulk of the bias transistor, wherein voltage applied to the bulk of the drive transistor and the bulk of the bias transistor varies in response to the input signal.

10. The circuit of claim 9 further comprising:

a level shifting transistor having a first current electrode coupled in series between an output terminal and the bias transistor, the level shifting transistor having a control electrode and first current electrode connected together and to the output terminal, a second current electrode coupled to the bias transistor, and a bulk that is coupled to the bulk of the bias transistor and to the bulk of the drive transistor.

11. The circuit of claim 9 wherein the drive stage further comprises:

a pull-up transistor having a first current electrode coupled to a power supply voltage terminal, a control electrode coupled to the input signal terminal and a second current electrode coupled to the output terminal.

12. The circuit of claim 9 further comprising:

a second bias stage, a second load and a second drive stage for providing an output signal wherein each of the second bias stage and the second drive stage comprises a transistor having a control electrode coupled to a complement input signal terminal and having a bulk connected together and to a terminal of the second load.

13. The circuit of claim 12 wherein the drive stage has a first pull-up transistor that is biased by the output signal and the second drive stage has a second pull-up transistor that is biased by the output signal in complement form.

14. The circuit of claim 12 wherein the load and the second load comprise both resistance and reactance.

15. The circuit of claim 9 wherein the load is one of either a transistor or a polysilicon resistor.

16. A circuit comprising:

a load having a first terminal coupled to a first voltage terminal and having a second terminal;

a first transistor having a control electrode coupled to an input signal terminal, a first current electrode coupled to a complementary output terminal and both a second current electrode and a bulk connected together and to the second terminal of the load;

a second transistor having a control electrode coupled to the input signal terminal, a first current electrode coupled to the first voltage terminal, a second current electrode coupled to the complementary output terminal, and a bulk connected to the bulk of the first transistor; and a pull-up transistor coupled in series with the second transistor, said pull-up transistor located between a second voltage terminal and the complementary output terminal.

17. The circuit of claim 16 further comprising:

a third transistor for level shifting, the third transistor having a first current electrode coupled to the complementary output terminal, a second current electrode coupled to the first current electrode of the first transistor, a control electrode connected to the first current electrode thereof, and a bulk connected to the bulk of both the first transistor and the second transistor.

18. The circuit of claim 16 wherein the first transistor and the second transistor have a first conductivity type and the pull-up transistor has a second conductivity type opposite the first conductivity type.

19. The circuit of claim 16 wherein the load comprises primarily a resistive load.

20. The circuit of claim 16 further comprising:

a second load having a first terminal coupled to the first voltage terminal and having a second terminal;

a third transistor having a control electrode coupled to a complement input signal terminal, a first current electrode coupled to a true output terminal and both a second current electrode and a bulk connected together and to the second terminal of the second load;

a fourth transistor having a control electrode coupled to the complement input signal, a first current electrode coupled to the first voltage terminal, a second current electrode coupled to the true output terminal, and a bulk connected to the bulk of the third transistor; and a second pull-up transistor coupled in series with the fourth transistor, said second pull-up transistor located between the second voltage terminal and the true output terminal.

21. The circuit of claim 20 wherein the pull-up transistor and the second pull-up transistor comprise cross-coupled control gates wherein a control gate of the pull-up transistor is coupled to the true output terminal and a control gate of the second pull-up transistor is coupled to the complementary output terminal.

22. The circuit of claim 16 wherein a threshold voltage of the first transistor and a threshold voltage of the second transistor is reduced in response to an increase in magnitude of an input signal applied to the input signal terminal.

23. The circuit of claim 16, wherein the load is one of either a transistor or a polysilicon resistor.

* * * * *